(12) United States Patent
Fang et al.

(10) Patent No.: US 11,223,117 B2
(45) Date of Patent: Jan. 11, 2022

(54) ELECTRONIC PACKAGE AND ELECTRONIC DEVICE HAVING THE ELECTRONIC PACKAGE

(71) Applicant: Siliconware Precision Industries Co., Ltd., Taichung (TW)

(72) Inventors: Bo-Siang Fang, Taichung (TW); Kuan-Ta Chen, Taichung (TW); Chia-Chu Lai, Taichung (TW); Ying-Wei Lu, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 40 days.

(21) Appl. No.: 16/044,154

(22) Filed: Jul. 24, 2018

(65) Prior Publication Data

US 2019/0319347 A1     Oct. 17, 2019

(30) Foreign Application Priority Data

Apr. 17, 2018   (TW) .................................. 107113036

(51) Int. Cl.
| | | |
|---|---|---|
| *H01Q 1/52* | (2006.01) | |
| *H01Q 1/38* | (2006.01) | |
| *H01Q 1/40* | (2006.01) | |
| *H01L 23/552* | (2006.01) | |
| *H01L 23/31* | (2006.01) | |
| *H01L 23/66* | (2006.01) | |

(52) U.S. Cl.
CPC ........... *H01Q 1/38* (2013.01); *H01L 23/3114* (2013.01); *H01L 23/3128* (2013.01); *H01L 23/552* (2013.01); *H01L 23/66* (2013.01); *H01Q 1/40* (2013.01); *H01L 2223/6605* (2013.01)

(58) Field of Classification Search
None
See application file for complete search history.

(56) References Cited

U.S. PATENT DOCUMENTS

| | | | | |
|---|---|---|---|---|
| 8,952,521 | B2 * | 2/2015 | Wojnowski | ....... H01L 23/49816 257/675 |
| 10,199,317 | B2 * | 2/2019 | Chiu | ..................... H01Q 19/104 |
| 2009/0267221 | A1 * | 10/2009 | Fujii | .................. H01L 23/3128 257/698 |
| 2015/0188510 | A1 * | 7/2015 | Lin | ...................... H03H 7/0115 333/185 |

(Continued)

FOREIGN PATENT DOCUMENTS

JP     2007 042978     *  2/2007  ............. H01Q 13/08

*Primary Examiner* — Trinh V Dinh

(74) *Attorney, Agent, or Firm* — Mintz Levin Cohn Ferris Glovsky and Popeo, P.C.; Peter F. Corless; Steven M. Jensen

(57) ABSTRACT

An electronic package includes: a carrier structure; a first electronic component disposed on the carrier structure; a first insulating layer formed on the carrier structure; a first antenna structure coupled to the first insulating layer and electrically connected to the first electronic component; and a second antenna structure embedded in the carrier structure. As such, the electronic package provides more antenna functions within a limited space so as to improve the signal quality and transmission rate of electronic products. An electronic device having the electronic package is also provided. The electronic device is applicable to an electronic product having an antenna function.

17 Claims, 3 Drawing Sheets

(56) References Cited

U.S. PATENT DOCUMENTS

2017/0201023 A1* 7/2017 Chiu ................ H01Q 9/065
2018/0053735 A1* 2/2018 Ueda ................ H01Q 9/0485
2018/0315715 A1* 11/2018 Chiu ................ H01L 21/568

* cited by examiner

ELECTRONIC PACKAGE AND ELECTRONIC DEVICE HAVING THE ELECTRONIC PACKAGE

CROSS-REFERENCE TO RELATED APPLICATION

This Application claims priority under 35 U.S.C. § 119(a) the benefit of Taiwanese Patent Application No. 107113036 filed on Apr. 17, 2018, the entire contents of which is incorporated herein by reference.

BACKGROUND

1. Technical Field

The present disclosure relates to electronic packages, and, more particularly, to an electronic package having an antenna structure and an electronic device having the electronic package.

2. Description of Related Art

Currently, wireless communication technologies have been widely applied in various types of consumer electronic products, such as mobile phones and tablet computers, to facilitate receiving/sending of wireless signals. To facilitate portability of the consumer electronic products and easy access to Internet (e.g., viewing multimedia contents), wireless communication modules are becoming compact and low-profiled. Patch antennas have been widely applied in wireless communication modules of electronic products due to their advantages of small size, light weight and easy fabrication.

In addition, along with the improvement of image quality, more and more multimedia data is produced. Accordingly, wireless transmission bandwidth needs to be increased. Therefore, the fifth generation (5G) wireless transmission technologies have been developed, which use higher frequency bands and hence have a stricter requirement on the size of corresponding wireless communication modules.

FIG. 1 is a schematic perspective view of a conventional wireless communication module 1. The wireless communication module 1 has a substrate 10, a plurality of electronic components 11 disposed on and electrically connected to the substrate 10, an antenna structure 12 disposed on the substrate 10, and an encapsulant 13. The substrate 10 is a rectangular circuit board. The antenna structure 12 is a patch antenna and has an antenna body 120 and a conductive wire 121 electrically connecting the antenna body 120 and the electronic components 11. The encapsulant 13 covers the electronic components 11 and a portion of the conductive wire 121.

However, a 5G system needs more antenna configurations to improve signal quality and transmission rate. In the conventional wireless communication module 1, since the antenna structure 12 is a patch antenna and the substrate 10 has a fixed size, the function of the antenna structure 12 is limited and cannot meet the requirement of antenna operation in the 5G system.

Therefore, how to overcome the above-described drawbacks has become critical.

SUMMARY

In view of the above-described drawbacks, the present disclosure provides an electronic package, which comprises: a carrier structure having opposite first and second sides; at least a first electronic component disposed on at least one of the first side and the second side of the carrier structure; a first insulating layer formed on the second side of the carrier structure; a first antenna structure coupled to the first insulating layer and electrically connected to the first electronic component; and a second antenna structure coupled to the carrier structure.

In an embodiment, the carrier structure has a circuit layer electrically connecting the first electronic component and the first antenna structure.

In an embodiment, the first antenna structure comprises a first antenna layer and a second antenna layer separated from the first antenna layer and arranged on opposite sides of the first insulating layer. In another embodiment, the first antenna layer and the second antenna layer are coupled to transmit signals.

In an embodiment, the second antenna structure is a conductive structure embedded in the carrier structure.

In an embodiment, the second antenna structure comprises a first conductive layer for grounding the first antenna structure.

In an embodiment, the second antenna structure comprises a plurality of conductive contacts exposed from the first side of the carrier structure. In another embodiment, the conductive contacts serve as signal input ports and grounding ports of the second antenna structure, and any two of the conductive contacts are spaced at a distance equal to ¼ to ¹⁄₁₀ wavelength of a signal of the second antenna structure.

In an embodiment, the electronic package further comprises a second insulating layer bonding the second antenna structure to the first side of the carrier structure. In another embodiment, the first electronic component is disposed on the first side of the carrier structure, encapsulated by the second insulating layer, and shielded by the second antenna structure.

In an embodiment, the first antenna structure is applicable to a first frequency band, the second antenna structure is applicable to a second frequency band, and if the first antenna structure is applied to the first frequency band, the second antenna structure serves as a ground for the first antenna structure.

The present disclosure further provides an electronic device, which comprises: a circuit board; an electronic package as described above, wherein the electronic package is bonded to the circuit board; and a second electronic component disposed on the circuit board and electrically connected to the second antenna structure of the electronic package.

In an embodiment, the electronic device further comprises a plurality of conductive structures disposed on the circuit board and electrically coupling the electronic package and the second electronic component. In another embodiment, the second antenna structure comprises a plurality of conductive contacts exposed from the first side of the carrier structure and electrically connected to the conductive structures.

In an embodiment, the electronic device further comprises a connector disposed on the circuit board and electrically connected to the electronic package.

According to the present disclosure, by vertically stacking the first antenna structure and the second antenna structure, such the multi-band electronic package provides more antenna functions within a limited space so as to improve the signal quality and transmission rate of electronic products using the electronic device. Compared with the prior art, the electronic device according to the present disclosure effectively meets the requirement of antenna operation in a 5G system.

DETAILED DESCRIPTION OF EMBODIMENTS

The following illustrative embodiments are provided to illustrate the disclosure of the present disclosure, these and other advantages and effects can be apparent to those in the art after reading this specification.

It should be noted that all the drawings are not intended to limit the present disclosure. Various modifications and variations can be made without departing from the spirit of the present disclosure. Further, terms such as "first", "second", "on", "a" etc. are merely for illustrative purposes and should not be construed to limit the scope of the present disclosure.

Figure 1:
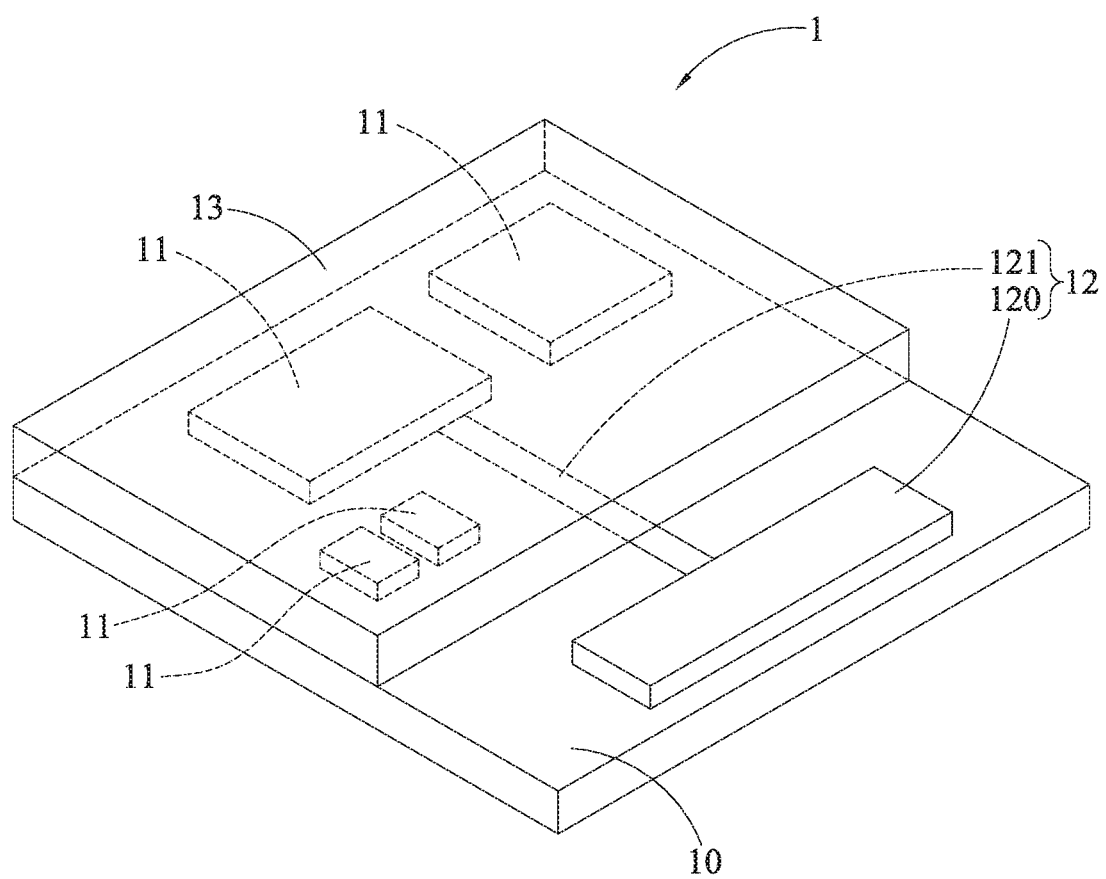
FIG. 1 is a schematic perspective view of a conventional wireless communication module.
Figure 2:
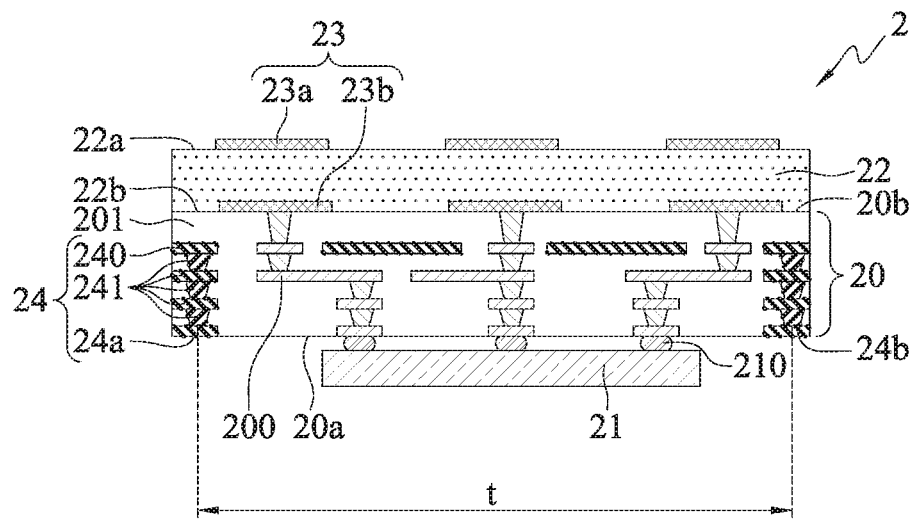
FIG. 2 is a schematic cross-sectional view of an electronic package according to a first embodiment of the present disclosure.

FIG. 2 is a schematic cross-sectional view of an electronic package 2 according to a first embodiment of the present disclosure. The electronic package 2 has a carrier structure 20 having opposite first and second sides 20a, 20b; at least a first electronic component 21 disposed on the first side 20a and/or second side 20b of the carrier structure 20; a first insulating layer 22 formed on the second side 20b of the carrier structure 20; a first antenna structure 23 bonded to the first insulating layer 22 and electrically connected to the first electronic component 21; and a second antenna structure 24 bonded to the carrier structure 20.

In an embodiment, the carrier structure 20 is a packaging substrate having a core layer and a circuit structure, or is a coreless circuit structure. The carrier structure 20 has a dielectric layer 201 and at least a circuit layer 200, such as a fan-out type redistribution layer, formed on the dielectric layer 201.

In an embodiment, the first electronic component 21 is disposed on the first side 20a of the carrier structure 20. In another embodiment, the first electronic component 21 is disposed on the second side 20b of the carrier structure 20 or on both the first and second sides 20a, 20b of the carrier structure 20.

In an embodiment, the first electronic component 21 is an active element, such as a semiconductor chip, a passive element, such as a resistor, a capacitor or an inductor, or a combination thereof. In another embodiment, the first electronic component 21 is a semiconductor chip having a millimeter-wave function. In yet another embodiment, the first electronic component 21 is flip-chip disposed on and electrically connected to the circuit layer 200 through a plurality of conductive bumps 210 made of, for example, a solder material. In still another embodiments, the first electronic component 21 is electrically connected to the circuit layer 200 through a plurality of bonding wires (not shown), or is in direct contact with the circuit layer 200.

In an embodiment, the first insulating layer 22 has a first surface 22a and a second surface 22b opposite to the first surface 22a. The first insulating layer 22 is bonded to the second side 20b of the carrier structure 20 through the second surface 22b. In an embodiment, the first insulating layer 22 is made of polyimide, a dry film, an epoxy resin, or a molding compound.

In an embodiment, the first antenna structure 23 has a first antenna layer 23a and a second antenna layer 23b separated from the first antenna layer 23a and arranged on opposite sides of the first insulating layer 22. The first antenna layer 23a is formed on the first surface 22a of the first insulating layer 22, and the second antenna layer 23b is formed on the second surface 22b of the first insulating layer 22 so as to be in contact with the second side 20b of the carrier structure 20 and electrically connected to the circuit layer 200. The first antenna layer 23a corresponds in position to the second antenna layer 23b. In an embodiment, the antenna layers are thin and fabricated by sputtering, evaporation, electroplating, electroless plating (chemical plating), or foiling. In an embodiment, a patterned conductive layer is formed on the first insulating layer 22 (or the carrier structure 20) to serve as the first antenna layer 23a or the second antenna layer 23b.

Further, the first antenna layer 23a and the second antenna layer 23b are coupled to transmit signals. In an embodiment, the first antenna layer 23a and the second antenna layer 23b generate radiation energy (i.e., an electromagnetic field) through alternating voltage, alternating current or radiation variation. As such, the first antenna layer 23a and the second antenna layer 23b are electromagnetically coupled to one another so as to transmit antenna signals therebetween.

The second antenna structure 24 has a first conductive layer 240 capable of serving as an antenna or grounding the first antenna structure 23, at least a wiring layer 241 electrically connected to the first conductive layer 240, and a plurality of conductive contacts 24a, 24b.

In an embodiment, the second antenna structure 24 is a conductive structure embedded in the carrier structure 20.

Further, the wiring area of the first conductive layer 240 on the carrier structure 20 is greater than that of the second antenna layer 23b bonded to the carrier structure 20. In an embodiment, the first conductive layer 240 is a complete, net-shaped, or patterned metal foil. In another embodiment, the first conductive layer 240 is a patterned conductive layer, and the second antenna structure 24 and the circuit layer 200 are fabricated through the same wiring process.

In an embodiment, the conductive contacts 24a. 24b are exposed from the first side 20a of the carrier structure 20 to serve as signal ports (I/O) or grounding ports (I/O). In another embodiment, the distance t between any two of the conductive contacts 24a, 24b is ¼ to ⅒ wavelength λ, of a signal (at such as a sub-6 GHz frequency) of the second antenna structure 24.

Figure 3:
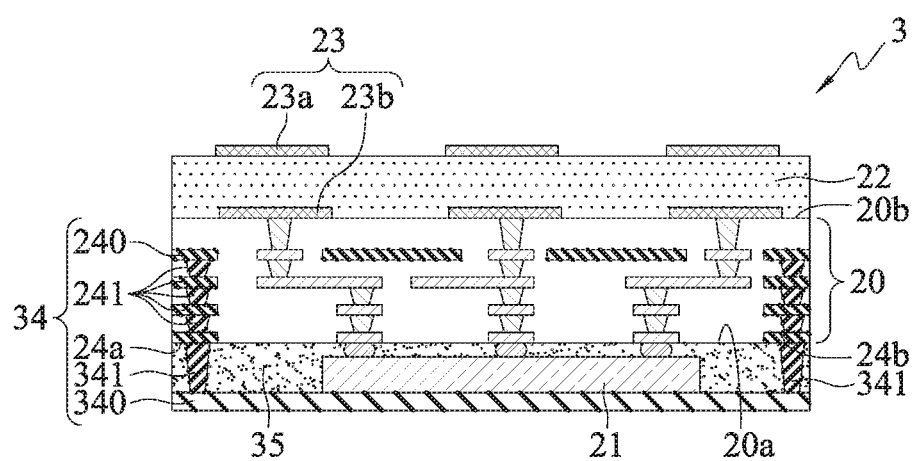
FIG. 3 is a schematic cross-sectional view of an electronic package according to a second embodiment of the present disclosure.

FIG. 3 is a schematic cross-sectional view of an electronic package 3 according to a second embodiment of the present disclosure. The second embodiment differs from the first embodiment in the arrangement of the second antenna structure 34.

Referring to FIG. 3, the second antenna structure 34 further has a second conductive layer 340 bonded to the first side 20a of the carrier structure 20 through a second insulating layer 35.

In an embodiment, the second insulating layer 35 is made of polyimide, a dry film, an epoxy resin, or a molding compound. The second insulating layer 35 and the first insulating layer 22 can be formed through a double-sided molding process. As such, the second insulating layer 35 encapsulates the first electronic component 21. The second insulating layer 35 and the first insulating layer 22 can be made of the same or different materials, and fabricated at the same time or different times.

Further, the second conductive layer 340 can serve as an antenna and/or provide a shielding function for the first electronic component 21 (for example, the second conductive layer 340 is in contact with the first electronic component 21). In an embodiment, the second conductive layer 340 is a complete, net-shaped metal foil, or a patterned conductive layer.

In an embodiment, the conductive contacts 24a, 24b can be electrically connected to the second conductive layer 340 through a plurality of conductors 341 and hence the second antenna structure 34 serves as a ground during antenna operation. In another embodiment, each of the conductors 341 has a post or bump shape and is made of a solder material, a metal material or other conductive material. The second insulating layer 35 can encapsulate the conductors 341.

In the electronic packages 2, 3 of the first and second embodiments, the first antenna structure 23 is applicable to a first frequency band such as 28 or 39 GHz, and the second antenna structure 24, 34 is applicable to a second frequency band, sub-6 GHz, for example. When the first antenna structure 23 operates at the first frequency band, antenna signals are transmitted from the first antenna structure 23 through the circuit layer 200 to the first electronic component 21 and processed by the first electronic component 21. Further, the second antenna structure 24, 34 serves as a ground for the first antenna structure 23 (through for example, a grounding path composed of by the first conductive layer 240, the wiring layer 241 and the conductive contacts 24a, 24b).

Further, the electronic package 2, 3 can use the first conductive layer 240 to protect the first electronic component 21 against cross talking, noise interference and radiation interference imposed by the external environment. In an embodiment, the first conductive layer 240 is made of multi-layer metal foils to enhance the shielding function.

Figure 4:
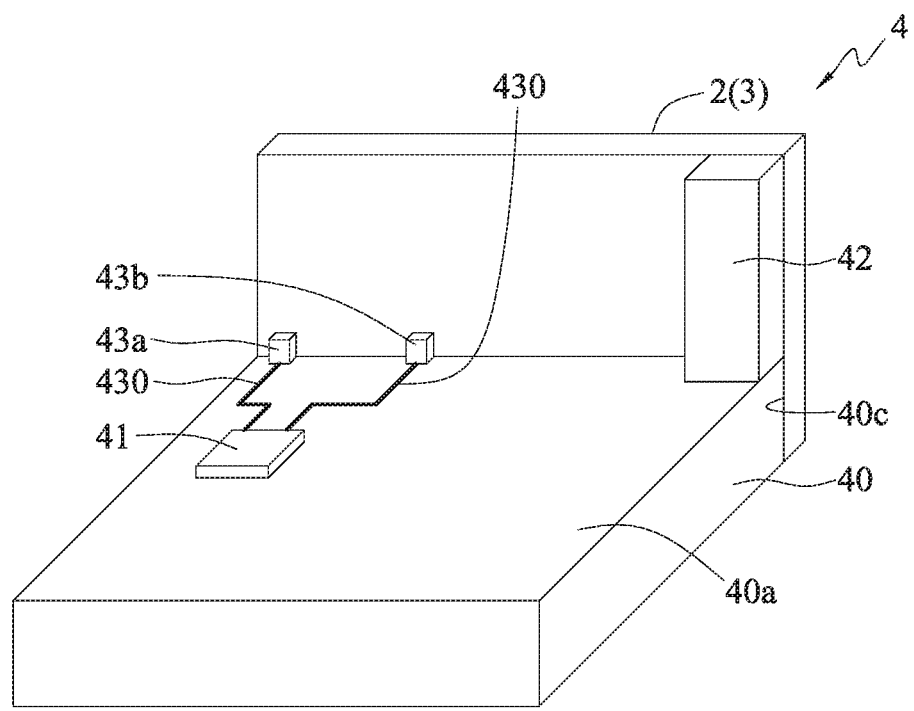
FIG. 4 is a schematic perspective view of an electronic device according to the present disclosure.

FIG. 4 is a schematic perspective view of an electronic device 4 according to the present disclosure. The electronic device 4 has a circuit board 40, the electronic package 2, 3 bonded to the circuit board 40, a second electronic component 41 disposed on the circuit board 40, and a connector 42.

The circuit board 40 is a printed circuit board, which is a main board of an electronic product. In an embodiment, the circuit board 40 is a mobile phone substrate.

The electronic package 2, 3 is generally in the shape of a plate and serves as an antenna substrate of an electronic product. The first side 20a of the carrier structure 20 is bonded to a side surface 40c of the circuit board 40, and the first antenna structure 23 in the electronic package 2, 3 transmits or receives antenna signals at the first frequency band (for example, 28 or 39 GHz).

The second electronic component 41 is disposed on a top surface 40a of the circuit board 40 and in front of the electronic package 2, 3. The second electronic component 41 is electrically connected to the conductive contacts 24a, 24b of the second antenna structure 24, 34 or the second conductive layer 340 through conductive structures 43a, 43b of the circuit board 40. As such, the second antenna structure 24, 34 transmits or receives antenna signals at the second frequency band (sub-6 GHz).

In an embodiment, the second electronic component 41 is a packaging module having a chip and a molding compound, an active element, such as a semiconductor chip, a passive element, such as a resistor, a capacitor or an inductor, or a combination thereof. In embodiment, the second electronic component 41 is a packaging module, which has an RF chip (for example, PAMid, PA or transceiver) for processing antenna signals of the second antenna structure 24, 34.

The conductive structures 43a, 43b are metal connecting mechanisms, such as elastic hooks or pogo pins. The conductive structures 43a, 43b are electrically connected to the second electronic component 41 through conductive wires 430 functioning as RF signal lines and grounding lines.

The connector 42 is arranged on the top surface 40a of the circuit board 40 and electrically connected to the circuit layer 200 of the electronic package 2, 3.

In an embodiment, the connector 42 provides electrical pins for the electronic package 2, 3, including pins for a power source, a ground, a control signal and an IF signal.

Therefore, in the electronic device 4, the electronic package 2, 3 has the first antenna structure 23 and the second antenna structure 24, 34 operating at different frequencies. When the second antenna structure 24, 34 operates at the second frequency band, antenna signals of the second antenna structure 24, 34 are processed by the second electronic component 41.

According to the present disclosure, by vertically stacking the first antenna structure 23 and the second antenna structure 24, 34, the multi-band electronic package 2, 3 provides more antenna functions within a limited space so as to improve the signal quality and transmission rate of electronic products (for example, a mobile phone) using the electronic device 4. Compared with the prior art, the electronic device 4 effectively meets the requirement of antenna operation in a 5G system.

The above-described descriptions of the detailed embodiments are only to illustrate the preferred implementation according to the present disclosure, and it is not to limit the scope of the present disclosure. Accordingly, all modifications and variations completed by those with ordinary skill in the art should fall within the scope of present disclosure defined by the appended claims.

What is claimed is:

1. An electronic package, comprising:
    a carrier structure having opposite first and second sides;
    at least a first electronic component disposed on the first side of the carrier structure;
    a first insulating layer formed on the second side of the carrier structure;
    a first antenna structure coupled to the first insulating layer and electrically connected to the first electronic component, wherein the first antenna structure generates a first frequency band;
    a second antenna structure coupled to the carrier structure and shielding the first electronic component, wherein the second antenna structure generates a second frequency band different from the first frequency band; and
    a second insulating layer bonding the second antenna structure to the first side of the carrier structure, wherein the second insulating layer encapsulates the first electronic component.

2. The electronic package of claim 1, wherein the carrier structure has a circuit layer electrically connecting the first electronic component and the first antenna structure.

3. The electronic package of claim 1, wherein the first antenna structure comprises a first antenna layer and a second antenna layer separated from the first antenna layer and arranged on opposite sides of the first insulating layer.

4. The electronic package of claim 3, wherein the first antenna layer and the second antenna layer are coupled to transmit signals.

5. The electronic package of claim 1, wherein the second antenna structure is a conductive structure embedded in the carrier structure.

6. The electronic package of claim 1, wherein the second antenna structure comprises a first conductive layer for grounding the first antenna structure.

7. The electronic package of claim 1, wherein the second antenna structure comprises a plurality of conductive contacts exposed from the first side of the carrier structure.

8. The electronic package of claim 7, wherein the conductive contacts serve as signal input ports and grounding ports of the second antenna structure, and any two of the conductive contacts are spaced at a distance equal to $\frac{1}{4}$ to $\frac{1}{10}$ wavelength of a signal of the second antenna structure.

9. The electronic package of claim 1, wherein if the first antenna structure is applied to the first frequency band, the second antenna structure serves as a ground for the first antenna structure.

10. An electronic device, comprising:
a circuit board;
an electronic package according to claim 1, wherein the electronic package is coupled to the circuit board; and
a second electronic component disposed on the circuit board and electrically connected to the second antenna structure of the electronic package.

11. The electronic device of claim 10, wherein the carrier structure has a circuit layer electrically connecting the first electronic component and the first antenna structure.

12. The electronic device of claim 10, wherein the first antenna structure comprises a first antenna layer and a second antenna layer separated from the first antenna layer and arranged on opposite sides of the first insulating layer, and the first antenna layer and the second antenna layer are coupled to transmit signals.

13. The electronic device of claim 10, wherein the second antenna structure is a conductive structure embedded in the carrier structure and comprises a first conductive layer for grounding the first antenna structure.

14. The electronic device of claim 10, wherein the second antenna structure comprises a plurality of conductive contacts exposed from the first side of the carrier structure and serving as signal input ports and grounding ports of the second antenna structure, and any two of the conductive contacts are spaced at a distance equal to $\frac{1}{4}$ to $\frac{1}{10}$ wavelength of a signal of the second antenna structure.

15. The electronic device of claim 14, further comprising a plurality of conductive structures disposed on the circuit board and electrically coupling the electronic package to the second electronic component, and the conductive contacts are electrically connected to the conductive structures.

16. The electronic device of claim 10, wherein if the first antenna structure is applied to the first frequency band, the second antenna structure serves as a ground for the first antenna structure.

17. The electronic device of claim 10, further comprising a connector disposed on the circuit board and electrically connected to the electronic package.

* * * * *